(12) United States Patent
Lee et al.

(10) Patent No.: US 9,673,358 B2
(45) Date of Patent: Jun. 6, 2017

(54) LIGHT EMITTING MODULE

(71) Applicant: Seoul Semiconductor Co., Ltd., Ansan-si (KR)

(72) Inventors: Jong Min Lee, Ansan-si (KR); Yang Sik Cho, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 12 days.

(21) Appl. No.: 14/771,321

(22) PCT Filed: Feb. 28, 2014

(86) PCT No.: PCT/KR2014/001701
§ 371 (c)(1),
(2) Date: Aug. 28, 2015

(87) PCT Pub. No.: WO2014/013367
PCT Pub. Date: Sep. 4, 2014

(65) Prior Publication Data
US 2016/0005931 A1    Jan. 7, 2016

(30) Foreign Application Priority Data

Feb. 28, 2013 (KR) .................. 10-2013-0021941
Feb. 28, 2014 (KR) .................. 10-2014-0024132

(51) Int. Cl.
*H01L 29/22*    (2006.01)
*H01L 33/48*    (2010.01)
(Continued)

(52) U.S. Cl.
CPC .......... *H01L 33/486* (2013.01); *H01L 33/505* (2013.01); *H01L 33/54* (2013.01); *H01L 33/60* (2013.01); *H01L 33/58* (2013.01)

(58) Field of Classification Search
CPC ..... H01L 33/486; H01L 33/50; H01L 33/505; H01L 33/54; H01L 33/58; H01L 33/60
(Continued)

(56) References Cited

U.S. PATENT DOCUMENTS 7,838,897 B2 * 11/2010 Higashi ................. H01L 33/60
257/100
2004/0190304 A1 * 9/2004 Sugimoto ................. F21K 9/00
362/555
(Continued)

FOREIGN PATENT DOCUMENTS

JP    2009087596 A    4/2009
JP    2011249855 A    12/2011
(Continued)

OTHER PUBLICATIONS

Korean Intellectual Property Office, International Search Report, International Application No. PCT/KR2014/001701, Jun. 16, 2014, 4 pages.

*Primary Examiner* — Matthew E Warren
(74) *Attorney, Agent, or Firm* — Perkins Coie LLP (57) ABSTRACT

Disclosed is a light-emitting module capable of not only improving appearance quality but also maximizing light efficiency. The disclosed light-emitting module comprises: a circuit board; a light-emitting diode chip which is flip-bonded on the circuit board; and a housing which is positioned on the circuit board and surrounds the light-emitting diode chip, wherein the housing has a recess and reflective part having a curvature structure formed on an inner wall of the recess.

18 Claims, 7 Drawing Sheets

(51) Int. Cl.
*H01L 33/60* (2010.01)
*H01L 33/50* (2010.01)
*H01L 33/54* (2010.01)
*H01L 33/58* (2010.01)

(58) Field of Classification Search
USPC .................................................. 257/98, 99
See application file for complete search history.

(56) References Cited

U.S. PATENT DOCUMENTS

| | | | |
|---|---|---|---|
| 2006/0043546 A1* | 3/2006 | Kraus | F21V 7/22 257/676 |
| 2006/0285804 A1* | 12/2006 | Kinoshita | H01L 33/60 385/92 |
| 2010/0327302 A1 | 12/2010 | Wang et al. | |
| 2011/0215342 A1* | 9/2011 | Oliver | B29C 43/18 257/81 |

FOREIGN PATENT DOCUMENTS

| | | | |
|---|---|---|---|
| JP | 2013012529 A | 1/2013 | |
| KR | 1020090119505 A | 11/2009 | |

* cited by examiner

LIGHT EMITTING MODULE

CROSS REFERENCE TO RELATED APPLICATION

This patent document is a 35 U.S.C. §371 National Stage application of PCT Application No. PCT/KR2014/001701, filed on Feb. 28, 2014, which further claims the benefits and priorities of prior Korean Patent Application No. 10-2013-0021941, filed on Feb. 28, 2013 and prior Korean Patent Application No. 10-2014-0024132, filed on Feb. 28, 2014. The entire disclosures of the above applications are incorporated by reference in their entirety as part of this document.

TECHNICAL FIELD

This patent document relates to a light emitting module including a light emitting module that can enhance appearance quality while maximizing luminous efficacy.

BACKGROUND

Recently, with broad distribution of digital cameras that can photograph an object and record photographed data on a recording medium such as a memory, mobile terminals, such as a mobile phone, which includes a camera module as a medium for transmission of video information, have been developed and distributed in the art.

The camera module of the mobile phone includes an image sensor configured to receive external light and recognize the received light as an image, and a light emitting module which, for example, manually supplies light to an object in order to satisfy various consumer demands.

The light emitting module used in the camera module selectively supplies light depending upon photographing environments. Thus, the light emitting module resides around the camera module and is exposed to the outside.

Since a typical light emitting module used in the camera module includes yellow phosphors placed on a blue light emitting diode, the yellow phosphors can be observed by the naked eye when the light emitting module is not operated, thereby causing a problem of deterioration in appearance quality.

In order to satisfy requirement for enhanced appearance quality and high brightness of the light emitting module, various studies have been actively carried out on enhancement of luminous efficacy through reduction in light loss.

SUMMARY

Exemplary embodiments of the disclosed technology provide a light emitting module capable of enhancing appearance quality such as disconnection while maximizing luminous efficacy.

In accordance with exemplary embodiments of the disclosed technology, a light emitting module includes: a circuit board; a light emitting diode chip flip-bonded to the circuit board; and a housing residing on the circuit board and surrounding the light emitting diode chip, wherein the housing has a recess and a reflective part having a curved structure formed on an inner wall of the recess. With the structure, the light emitting module can improve luminous efficacy.

In some implementations, the reflective part includes at least two reflective regions, each reflective region formed at different location along a height of the housing.

In some implementations, the reflective part includes a first reflective portion, and a second reflective portion, wherein the second reflective portion is placed to reach a first height above the circuit board and the first reflective portion is placed above the second reflective portion to reach a second height above the first height, and wherein each of the first and second reflective portions includes at least two reflective regions each having a curved structure and placed on different locations along a height of the housing.

In some implementations, the reflective regions of the first reflective portion continuously extend parallel to each other along an inner wall of the housing.

In some implementations, the second reflective portion includes protrusions protruding in a lateral direction of the light emitting diode chip, and the protrusions are arranged at regular intervals along a side surface of the light emitting diode chip.

In some implementations, the protrusions face the side surface of the light emitting diode chip.

In some implementations, the second reflective portion includes a step portion placed at an interface between the first reflective portion and the protrusions.

In some implementations, the housing includes a plurality of indentations formed at outer lower ends of the housing.

In some implementations, at least one of the indentations is configured to receive an electronic device.

In some implementations, the housing further includes a plurality of bumps protruding upwards from an upper surface of the housing and a lens is disposed inside the bumps on the upper surface of the housing.

In some implementations, the housing includes a plurality of receiving grooves formed on an upper surface of the housing. In some implementations, the lens is disposed on the upper surface of the housing and includes a plurality of bumps formed on a lower surface of the housing and arranged in the receiving grooves.

In some implementations, the light emitting diode chip includes a wavelength conversion layer covering upper and lower surfaces of a substrate having a semiconductor layer and an electrode pad, and a $TiO_2$ diffusion layer covering the wavelength conversion layer.

In some implementations, the housing includes an upper surface and a bump formed on the upper surface, the bump being placed near the reflective part.

In some implementations, the light emitting module further includes a lens disposed on the housing, wherein the lens has a step structure at an edge of a lower surface of the lens and a Fresnel lens structure inside the step structure.

In some implementations, wherein the step structure faces the upper surface and the bump of the housing.

In some implementations, the circuit board includes a recess receiving the light emitting diode chip, an inner side surface of the recess extending from the reflective part.

In some implementations, the light emitting module further includes a silver (Ag) coating formed on the reflective part.

In some implementations, the light emitting module further includes: a lens disposed on the housing; and a bonding structure attaching the lens to the housing, wherein the lens includes at least one of silicone, epoxy, glass, or PMMA, and the bonding structure includes an epoxy resin.

In some implementations, the circuit board includes a lead frame or a conductive pattern and includes a printed circuit board (PCB) or a ceramic substrate.

According to exemplary embodiments of the disclosed technology, a reflective part having a concavely curved structure is provided along an inner side surface of a recess of a housing formed of or including metal such that light emitted from the light emitting diode chip can be reflected along various paths by the reflective part. Accordingly, the light emitting module according to the exemplary embodiments of the disclosed technology can maximize luminous efficacy by minimizing internal light loss.

Furthermore, according to the exemplary embodiments of the disclosed technology, the housing has a plurality of reflective regions each having a curved structure and divided along a height of an inner side of a recess such that light emitted from the light emitting diode chip can be reflected in various directions by the reflective regions, thereby maximizing luminous efficacy.

Furthermore, the light emitting module according to the exemplary embodiments of the disclosed technology may further include a $TiO_2$ diffusion layer covering a wavelength conversion layer such that the wavelength conversion layer including a yellow phosphor layer is covered with white. Thus, it is possible to enhance appearance quality of the light emitting module.

In addition, according to the exemplary embodiments of the disclosed technology, a contact area between the housing and a lens is increased through a step structure of the lens, thereby enhancing adhesion therebetween. Further, the lens is aligned on the housing by the step structure, thereby minimizing an alignment error.

BRIEF DESCRIPTIONS OF THE DRAWINGS

FIG. 4(*a*) is a bottom view of the light emitting diode chip shown in FIG. 1 and FIG. 4(*b*) is a cross-sectional view of the light emitting module taken along line A-A of FIG. 4(*a*).

DETAILED DESCRIPTION

Hereinafter, exemplary embodiments of the disclosed technology will be described in more detail with reference to the accompanying drawings. The following embodiments are provided by way of example so as to facilitate the understanding of some implementations of the disclosed technology to those skilled in the art to which the disclosed technology pertains. Accordingly, the disclosed technology is not limited to the embodiments disclosed herein and may also be implemented in different forms. In the drawings, widths, lengths, thicknesses, and the like of elements may be exaggerated for clarity and descriptive purposes. Throughout the specification, like reference numerals denote like elements having the same or similar functions.

Figure 1:
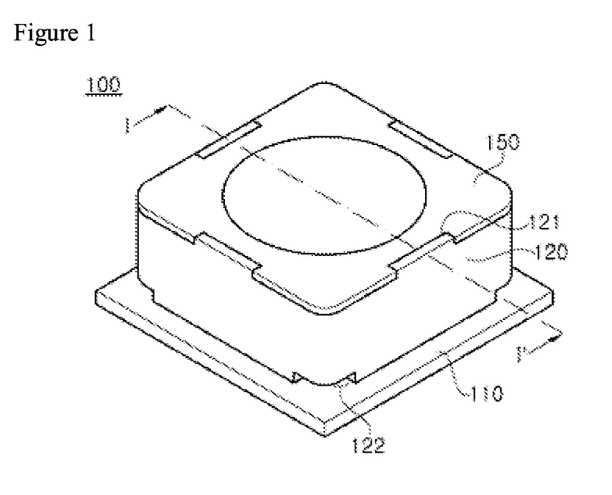
FIG. 1 is a perspective view of an exemplary light emitting module according to a first exemplary embodiment of the disclosed technology.
Figure 2:
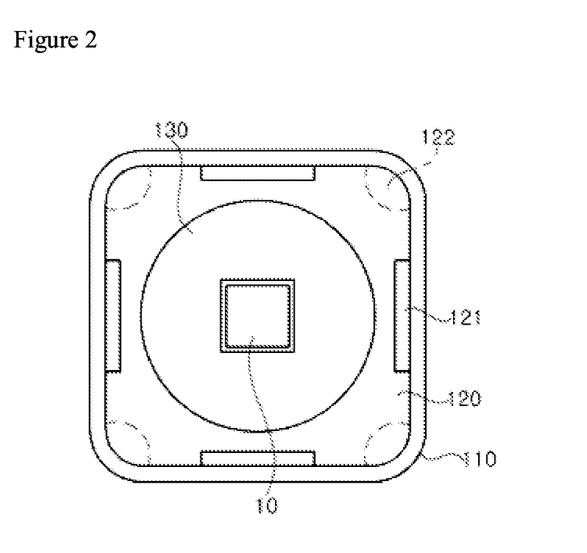
FIG. 2 is a plan view of the light emitting module shown in FIG. 1.
Figure 3:
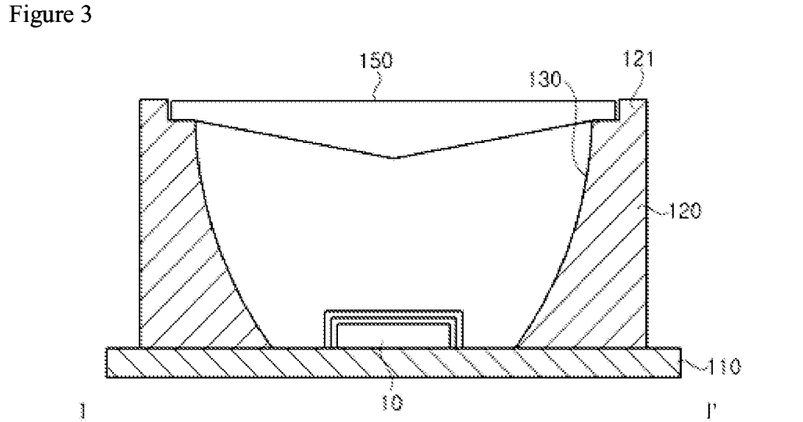
FIG. 3 is a cross-sectional view of the light emitting module taken along line I-I' of FIG. 1.

FIG. 1 is a perspective view of a light emitting module according to a first exemplary embodiment of the disclosed technology, FIG. 2 is a plan view of the light emitting module shown in FIG. 1, and FIG. 3 is a cross-sectional view of the light emitting module taken along line I-I' of FIG. 1.

Referring to FIG. 1 to FIG. 3, a light emitting module 100 according to the first exemplary embodiment of the disclosed technology includes a circuit board 110, a housing 120, a light emitting diode chip 10, and a lens 150.

The circuit board 110 includes a lead frame (not shown) or a conductive pattern (not shown). The circuit board 110 may be or include a printed circuit board or a ceramic substrate.

The housing 120 envelops or surrounds the light emitting diode chip 10 and resides on the circuit board 110. The housing 120 is formed of or includes a metallic material and may be attached to an upper side of the circuit board 110 by a soldering process or a silicone resin.

The housing 120 has a recess formed at a central region thereof, and includes a reflective part 130 formed on an inner side surface of the recess, a plurality of bumps 121 formed on an upper surface of the housing 120, and a plurality of indentations 122 disposed at outer corners of the housing 120.

The reflective part 130 has a curved structure extending along the inner side surface of the recess.

The reflective part 130 has a function of reflecting light emitted from the light emitting diode chip 10 in various directions to enhance luminous efficacy of the light emitting module 100. The reflective part 130 may include a highly reflective material coating. For example, Ag may be coated onto the reflective part 130. Ag may be coated onto the entirety of the housing 120 and may be coated onto the circuit board 110.

Light emitted from the light emitting diode chip 10 may be reflected in various directions at reflection points on the curved structure of the reflective part 130, thereby preventing loss of light laterally emitted from the light emitting diode chip 10.

The plurality of indentations 122 provide spaces in which electronic devices such as Zener diodes (not shown) can be mounted in the light emitting module 100.

The indentations 122 are arranged at regular intervals along an outer lower portion of the housing 120. For example, the indentations 122 are placed at lower corers of the housing 120.

Although the indentations 122 are illustrated as being formed at the corners of the housing 120 such that the circuit board 110 is partially exposed therethrough in this exemplary embodiment, it should be understood that the disclosed technology is not limited thereto and the housing 120 may include an indentation structure formed along a lower part thereof so as to expose the circuit board 110.

The plural indentations 122 are separated from the recess in which the light emitting diode chip 10 is disposed, thereby enhancing luminous efficacy. For example, in a typical light emitting module, a light emitting diode chip and electronic devices are disposed in a recess, so that light emitted from the light emitting diode chip is absorbed or reflected by the electronic devices, thereby deteriorating luminous efficacy of the light emitting module. In the exemplary embodiment of the disclosed technology, the indentations 122 are formed to allow the electronic devices to be separated from the recess and mounted on the circuit board 110, thereby preventing deterioration in luminous efficacy due to absorption or reflection of light by the electronic devices.

According to this exemplary embodiment, the light emitting module 100 includes a Zener diode (not shown) disposed in one of the plural indentations 122. The Zener diode has a function of preventing damage to the light emitting diode chip 10 by static electricity from the outside. That is, the Zener diode allows the light emitting module 100 to be stably operated.

The bumps 121 have a function of fixing the position of the lens 150 by aligning the lens 150. The bumps 121 may be separated by a certain distance from the upper surface of the housing 120 and protrude upwards from the upper surface of the housing 120.

Inner surfaces of the bumps 121 may face an outer surface of the lens 150.

The lens 150 has a flat upper surface and includes a wedge structure on a lower surface thereof. It should be understood that the structure of the lens 150 is not limited thereto and may be modified in various ways. For example, the lens 150 may be or include a Fresnel lens. The Fresnel lens may have a plurality of patterns corresponding to the shape of the recess. For example, the plurality of patterns may have a circular structure corresponding to a circular structure of the recess. In some implementations, the plurality of patterns may have a different shape from the shape of the recess. For example, the plurality of patterns may have a quadrangular structure that is different from the circular structure of the recess.

The lens 150 is aligned on the upper surface of the housing 120 by the bumps 121.

Although not shown in the drawings, the lens 150 may be coupled to the upper surface of the housing by a bonding structure or member (not shown) or an adhesive material (not shown). The lens 150 may be formed of or include silicone, epoxy, glass or PMMA, without being limited thereto. In addition, the bonding member or structure (not shown) or the adhesive material (not shown) may be formed of or include an epoxy resin.

According to this exemplary embodiment, the housing 120 is formed of or includes a metallic material, and includes the reflective part 130 of the concavely curved structure along the inner side surface of the recess to reflect light emitted from the light emitting diode chip 10 in various directions. Accordingly, the light emitting module 100 according to this exemplary embodiment can minimize internal light loss, thereby maximizing luminous efficacy.

The light emitting diode chip 10 will be described in more detail with reference to FIG. 4.

Figure 4A:
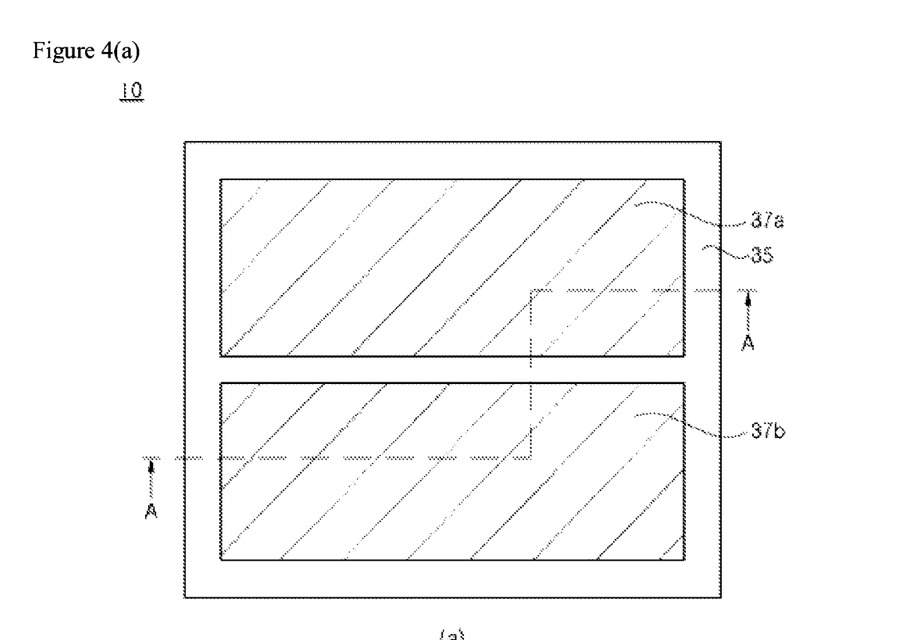
Figure 4B:
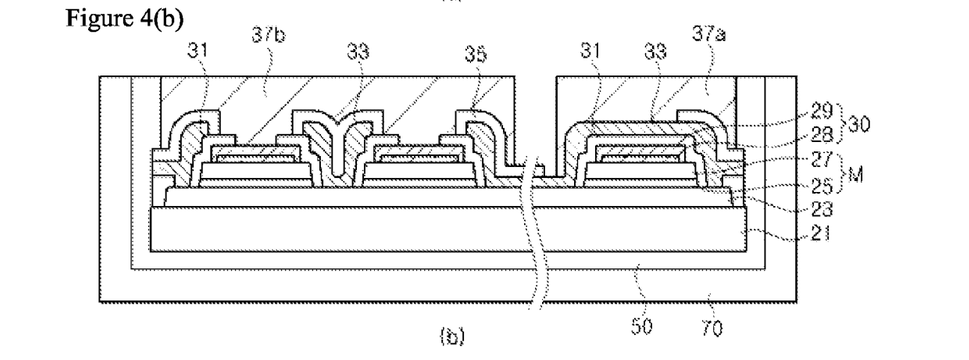

FIG. 4(a) is a bottom view of the light emitting diode chip shown in FIG. 1 and FIG. 4(b) is a cross-sectional view of the light emitting module taken along line A-A of FIG. 4(a).

Referring to FIGS. 3 and 4, the light emitting diode chip 10 according to this exemplary embodiment is directly flip-bonded to the circuit board 110 without using a bonding wire. Since the bonding wire is not used upon bonding of the light emitting diode chip to the circuit board 110, the light emitting module does not require a molding part for protection of the bonding wire or removal of part of a wavelength conversion layer 50 to expose a bonding pad. Thus, use of the light emitting diode chip 10 allows removal of color deviation or bright spots, thereby simplifying a module fabrication process as compared with use of a light emitting diode chip requiring a bonding wire.

In some implementations, the light emitting diode chip 10 is a flip-chip type semiconductor chip formed of or including a gallium nitride-based compound semiconductor and can emit light in the ultraviolet or blue wavelength band.

The light emitting diode chip 10 includes the wavelength conversion layer 50.

The wavelength conversion layer 50 covers the light emitting diode chip 10. As shown in the drawings, the wavelength conversion layer 50, for example, a phosphor layer, may be formed on the light emitting diode chip 10 by conformal coating and convert wavelengths of light emitted from the light emitting diode chip 10. The wavelength conversion layer 50 is coated onto the light emitting diode chip 10 to cover upper and side surfaces of the light emitting diode chip 10.

According to this exemplary embodiment, for example, when the light emitting diode chip 10 emits blue light, the wavelength conversion layer 50 is composed of or includes a yellow phosphor layer on the light emitting diode chip 10.

The light emitting diode chip 10 includes a $TiO_2$ diffusion layer 70 covering the wavelength conversion layer 50.

The $TiO_2$ diffusion layer 70 may cover both upper and side surfaces of the wavelength conversion layer 50.

The $TiO_2$ diffusion layer 70 covers the wavelength conversion layer 50, which exhibits a yellow color due to the yellow phosphor layer, and converts the light passing through the wavelength conversion layer 50 into white light, thereby enhancing appearance quality.

In this exemplary embodiment, the wavelength conversion layer 50 formed by conformal coating and the $TiO_2$ diffusion layer 70 may be previously formed in fabrication of the light emitting diode chip 10 to be mounted together with the light emitting diode chip 10 on the circuit board 110.

Hereinafter, a method for fabricating the light emitting diode chip 10 will be schematically described in order to aid in understanding of some implementations of the disclosed technology.

A first conductive type semiconductor layer 23 is formed on a growth substrate 21, and a plurality of mesas M separated from each other is formed on the first conductive type semiconductor layer 23. Each of the mesas M includes an active layer 25 and a second conductive type semiconductor layer 27. The active layer 25 is interposed between the first conductive type semiconductor layer 23 and the second conductive type semiconductor layer 27. Reflective electrodes 30 are placed on the plurality of mesas M, respectively.

The plurality of mesas M may be formed by growing epitaxial layers including the first conductive type semiconductor layer 23, the active layer 25 and the second conductive type semiconductor layer 27 on the growth substrate 21 by metal organic vapor deposition or the like, followed by patterning the second conductive type semiconductor layer 27 and the active layer 25 so as to expose the first conductive type semiconductor layer 23. The plurality of mesas M may have inclined side surfaces, which may be formed by a technology such as photoresist reflow. The inclined profiles of the mesas M enhance efficiency in extraction of light generated in the active layer 25.

As shown, the plurality of mesas M may have an elongated shape and extend parallel to each other in one direction. Such a shape simplifies formation of the plurality of mesas M having the same shape in plural chip areas on the growth substrate 21.

On the other hand, although the reflective electrode 30 can be formed on each of the mesas M after formation of the plural mesas M, it should be understood that the disclosed technology is not limited thereto and the reflective electrodes 30 may be previously formed on the second conductive type semiconductor layer 27 after growth of the second conductive type semiconductor layer 27 and before formation of the mesas M. The reflective electrode 30 covers substantially the entirety of an upper surface of the mesa M and has substantially the same shape as that of the mesa M in plan view.

The reflective electrodes 30 include a reflective layer 28 and may further include a barrier layer 29. The barrier layer 29 may cover an upper surface and a side surface of the reflective layer 28.

After formation of the plurality of mesas M, the first conductive type semiconductor layer 23 may also be subjected to etching along an edge thereof. As a result, the upper surface of the substrate 21 can be exposed. The first conductive type semiconductor layer 23 may also have an inclined side surface.

A lower insulation layer 31 is formed to cover the plurality of mesas M and the first conductive type semiconductor layer 23. The lower insulation layer 31 has openings in certain areas such that electrical connection to the first conductive type semiconductor layer 23 and the second conductive type semiconductor layer 27 can be achieved therethrough. For example, the lower insulation layer 31 may have openings that expose the first conductive type semiconductor layer 23 and openings that expose the reflective electrodes 30.

A current spreading layer 33 is formed on the lower insulation layer 31. The current spreading layer 33 covers the plurality of mesas M and the first conductive type semiconductor layer 23. In addition, the current spreading layer 33 has openings formed in upper areas of the mesas M and exposing the reflective electrodes, respectively. The current spreading layer 33 may form ohmic contact with the first conductive type semiconductor layer 23 through the openings of the lower insulation layer 31. The current spreading layer 33 is insulated from the plurality of mesas M and the reflective electrodes 30 by the lower insulation layer 31.

An upper insulation layer 35 is formed on the current spreading layer 33. The upper insulation layer 35 has an opening that exposes the current spreading layer 33, and openings that expose the reflective electrodes 30.

A first pad 37a and a second pad 37b are formed on the upper insulation layer 35. The first pad 37a is connected to the current spreading layer 33 through the opening of the upper insulation layer 35, and the second pad 37b is connected to the reflective electrodes 30 through the openings of the upper insulation layer 35. The first pad 37a and the second pad 37b may be used as pads for SMT or bump connection to mount a light emitting diode on a sub-mount, a package or a printed circuit board.

The light emitting diode chip 10 is formed with a wavelength conversion layer 50, which covers the entirety of the light emitting diode chip 10 excluding one surface of each of the first and second pads 37a and 37b to be connected to a package or a printed circuit board.

In addition, the light emitting diode chip 10 is formed with a $TiO_2$ diffusion layer 70 covering the wavelength conversion layer 50.

Figure 5:
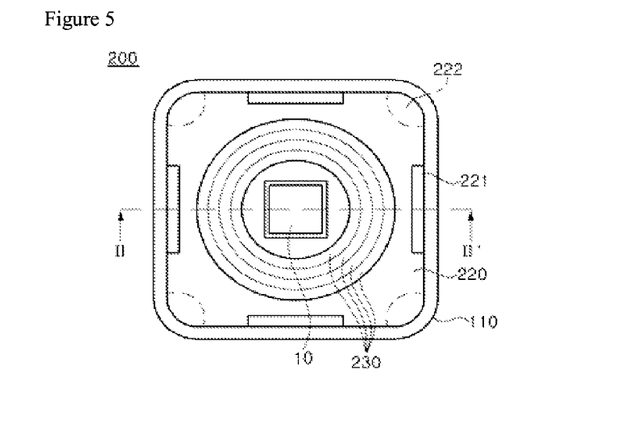
FIG. 5 is a plan view of an exemplary light emitting module according to a second exemplary embodiment of the disclosed technology.
Figure 6:
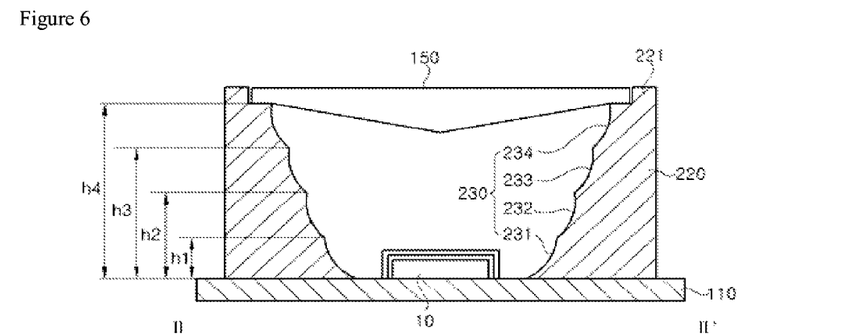
FIG. 6 is a cross-sectional view of the light emitting module taken along line II-IF of FIG. 5.

FIG. 5 is a plan view of a light emitting module according to a second exemplary embodiment of the disclosed technology, and FIG. 6 is a cross-sectional view of the light emitting module taken along line II-IF of FIG. 5

Referring to FIG. 5 and FIG. 6, a light emitting module 200 according to the second exemplary embodiment of the disclosed technology includes the same structure as that of the light emitting module 100 (see FIG. 1) according to the first exemplary embodiment excluding a housing 220, and thus the same components are indicated by the same reference numerals and detailed descriptions thereof are omitted.

The housing 220 envelops a light emitting diode chip 10 and resides on a circuit board 110. The housing 220 is formed of a metallic material and may be attached to an upper side of the circuit board 110 via a soldering process or a silicone resin.

The housing 220 has a recess formed at a central region thereof, and includes a reflective part 230 formed on an inner side surface of the recess, a plurality of bumps 221 formed on an upper surface of the housing 220, and a plurality of indentations 222 disposed at outer corners of the housing 220.

The reflective part 230 has a curved structure extending continuously along the inner side surface of the recess. The reflective part 230 may include a highly reflective material coating. For example, Ag may be coated onto the reflective part 230. Ag may be coated onto the entirety of the housing 220 and may be coated onto the circuit board 110. The reflective part 230 has first to fourth reflective regions 231 to 234 divided in an upward direction with reference to the circuit board 110.

The first to fourth reflective regions 231 to 234 may be divided according to heights h1 to h4 of the housing 230.

Each of the first to fourth reflective regions 231 to 234 has a curved structure extending continuously in the horizontal direction. For example, the first to fourth reflective regions 231 to 234 have a curved structure that surrounds the light emitting diode chip 10.

Light emitted from the light emitting diode chip 10 may be reflected in various directions by the curved structures of the first to fourth reflective regions 231 to 234 divided according to the heights h1 to h4 of the housing 220.

According to the second exemplary embodiment of the disclosed technology, the reflective part 230 includes the first to fourth reflective regions 231 to 234 divided according to the heights h1 to h4 of the housing 220 such that light emitted from the light emitting diode chip 10 is reflected in various directions by these reflective regions, thereby enhancing luminous efficacy of the light emitting module 200.

Light emitted from the light emitting diode chip 10 may be reflected in various directions at reflection points on the curved structure of the reflective part 230, thereby preventing loss of light laterally emitted from the light emitting diode chip 10.

A plurality of indentations 222 and a plurality of bumps 221 are similar to those of the light emitting module 100 (see FIG. 1) according to the first exemplary embodiment, and detailed descriptions thereof are omitted.

Although the reflective part 230 according to the second exemplary embodiment is illustrated as having the first to fourth reflective regions 231 to 234 each having the curved structure and divided according to the heights h1 to h4 of the housing 220, it should be understood that the disclosed technology is not limited thereto and the reflective part 230 may include any structures wherein the reflective part 230 is divided into at least two regions according to the height of the housing 220.

In the light emitting module 200 according to the second exemplary embodiment described above, the housing 220 formed of or including the metallic material has the reflective part 230 formed on the inner side surface of the recess, in which the reflective part 230 includes the first to fourth reflective regions 231 to 234 each having the curved structure and divided according to the heights h1 to h4 of the housing 220, whereby light emitted from the light emitting diode chip 10 can be reflected along various paths. Accordingly, the light emitting module 200 according to this exemplary embodiment can maximize luminous efficacy by minimizing internal light loss.

Figure 7:
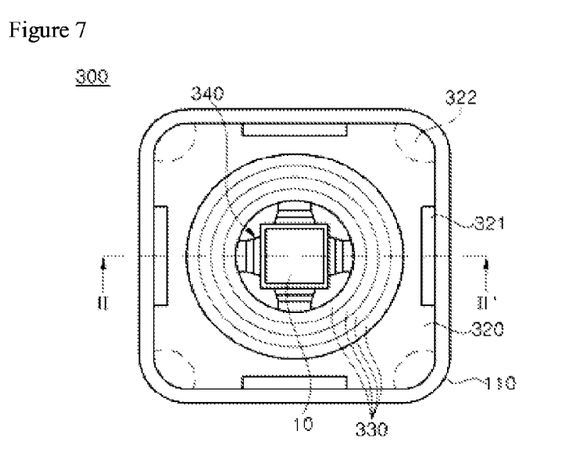
FIG. 7 is a plan view of a light emitting module according to a third exemplary embodiment of the disclosed technology.
Figure 8:
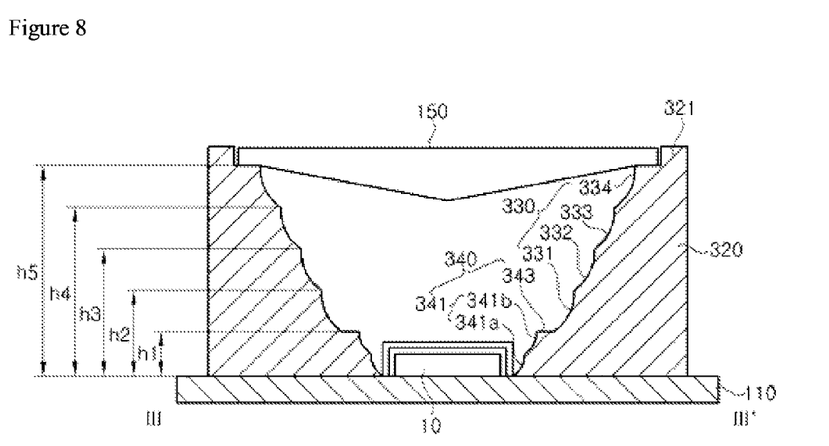
FIG. 8 is a cross-sectional view taken along line III-III' of FIG. 7.

FIG. 7 is a plan view of a light emitting module according to a third exemplary embodiment of the disclosed technology, and FIG. 8 is a cross-sectional view taken along line III-III' of FIG. 7.

Referring to FIG. 7 and FIG. 8, a light emitting module 300 according to a third exemplary embodiment of the disclosed technology includes the same structure as that of the light emitting module 100 (see FIG. 1) according to the first exemplary embodiment excluding a housing 320, and thus the same components are indicated by the same reference numerals and detailed descriptions thereof are omitted.

The housing 320 envelops a light emitting diode chip 10 and resides on a circuit board 110. The housing 320 is formed of or includes a metallic material and may be attached to an upper side of the circuit board 110 by a soldering process or a silicone resin.

The housing 320 has a recess formed at a central region of the housing 320, and includes first and second reflective portions 330 and 340 formed on an inner side surface of the recess, a plurality of bumps 321 formed on an upper surface of the housing 120, and a plurality of indentations 322 disposed at outer corners of the housing 320.

The second reflective portion 340 is placed within a first height h1 with reference to the circuit board 110, and the first reflective portion 330 is placed within a fifth height h5, which is defined as a total height of the housing 320 except the first height h1. Each of the first and second reflective portions 330, 340 may include a highly reflective material coating. For example, Ag may be coated onto each of the first and second reflective portions 330 and 340. Ag may be coated onto the entirety of the housing 320 and may be coated onto the circuit board 110.

The first reflective portion 330 has a curved structure extending continuously along the inner side surface of the recess.

The first reflective portion 330 has first to fourth reflective regions 331 to 334 divided in the upward direction above the first height h1 with reference to the circuit board 110.

The first to fourth reflective regions 331 to 334 may be divided according to a height of the housing 320. That is, the first to fourth reflective regions 331 to 334 may be divided above the first height h1 of the housing 320.

Each of the first to fourth reflective regions 331 to 334 has a curved structure extending continuously in the horizontal direction. More specifically, the first to fourth reflective regions 331 to 334 have a curved structure that envelops the light emitting diode chip 10.

Light emitted from the light emitting diode chip 10 may be reflected in various directions by the curved structures of the first to fourth reflective regions 331 to 334 divided within the fifth height h5 of the housing 320 except the first height h1.

The second reflective portion 340 may include sections arranged at constant intervals in the horizontal direction within the first height h1.

The second reflective portion 340 has a function of compensating for a gap between both sides of the light emitting diode chip 10 and the housing 320. For example, a gap between a side surface of the light emitting diode chip 10 and a lower end of an inner side surface of the housing 320 can vary depending upon the structure of the light emitting diode chip 10. For example, a distance between a corner of the light emitting diode chip 10 and the inner side surface of the housing 320 is narrower than a side surface of the light emitting diode chip 10 and the inner side surface of the housing 320. Thus, light reflected by the housing 320 can be minutely non-uniform on the corner and the side surface of the light emitting diode chip 10. According to this exemplary embodiment of the disclosed technology, the second reflective portion 340 has a function of compensating for non-uniform light due to the gap between the side surface of the light emitting diode chip 10 and the lower end of the inner side surface of the housing 320.

The second reflective portion 340 has a plurality of sections formed along the inner side surface of the recess at different heights and surrounding four side surfaces of the light emitting diode chip 10.

The plurality of sections of the second reflective portion 340 are structured to have four identical regions corresponding to and opposite the four side surfaces of the light emitting diode chip 10 in the plan view of FIG. 7.

The second reflective portion 340 includes protrusions 341, which face the side surface of the light emitting diode chip 10 within the height h1 of the housing 320 and protrudes towards the inner surface of the light emitting diode chip 10, and a step portion 343 formed by formation of the protrusions 341.

Each of the protrusions 341 includes fifth and sixth reflective regions 341a and 341b divided in the upward direction of the housing 320.

The fifth and sixth reflective regions 341a and 341b may be divided according to the height of the housing 320 within the first height h1.

The fifth and sixth reflective regions 341a and 341b have curved structures divided within the second reflective portion 340.

Light emitted outwards from the light emitting diode chip 10 is reflected in various directions by the curved structures of the fifth and sixth reflective regions 341a and 341b which are divided within the first height h1 of the housing 320.

The first height h1 is greater than or the same as the height of the light emitting diode chip 10.

Although the second reflective portion 340 is illustrated as having the two curved structures of the fifth and sixth reflective regions 341a, 341b, it should be understood that the disclosed technology is not limited thereto and the second reflective portion 340 may have at least three curved structures divided from one another.

The step portion 343 may be formed at an interface between the protrusions 341 and the first reflective portion 330.

A plurality of indentations 322 and a plurality of bumps 321 are similar to those of the light emitting module 100 (see FIG. 1) according to the first exemplary embodiment, and detailed descriptions thereof are omitted.

The first and second reflective portions 330 and 340 according to the third exemplary embodiment are illustrated as having the first to sixth reflective regions 331 to 334, 341a, and 341b divided according to the height of the housing 320 to reflect light emitted from the light emitting diode chip 10 in various directions, thereby enhancing luminous efficacy of the light emitting module 300.

Furthermore, in the light emitting module 300 according to the third exemplary embodiment of the disclosed technology, light emitted from a side surface of the light emitting diode chip 10 is reflected by the second reflective portion 340 to compensate for a minute difference of reflected light due to the gap between the light emitting diode chip 10 and the lower end of the inner surface of the housing 320, thereby preventing light loss while realizing generally uniform light.

Figure 9:
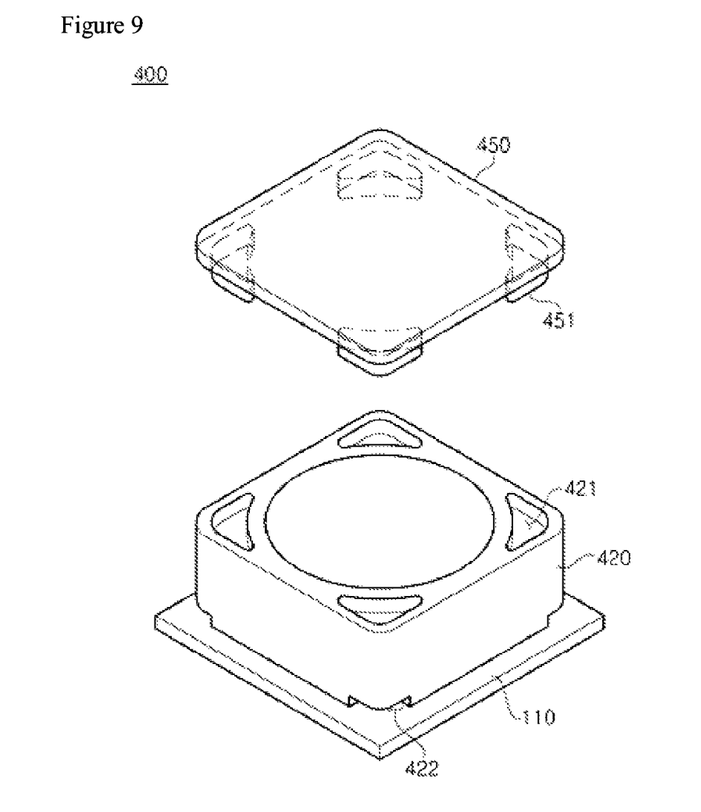
FIG. 9 is a perspective view of an exemplary light emitting module according to a fourth exemplary embodiment of the disclosed technology.

FIG. 9 is a perspective view of a light emitting module according to a fourth exemplary embodiment of the disclosed technology.

Referring to FIG. 9, a light emitting module 400 according to the fourth exemplary embodiment of the disclosed technology includes a circuit board 110, a housing 420, a light emitting diode chip (not shown), and a lens 450.

The housing 420 envelops the light emitting diode chip (not shown) and resides on the circuit board 110. The housing 420 is formed of or including a metallic material and may be attached to an upper side of the circuit board 110 via a soldering process or a silicone resin.

The housing 420 has a recess formed at a central region of the housing 420, and includes a reflective part (not shown) formed on an inner side surface of the recess, a plurality of receiving grooves 421 formed on an upper surface of the housing 420, and a plurality of indentations 422 disposed at outer corners of the housing 420.

The plural receiving grooves 421 may be formed near corners of the upper surface of the housing 420. The plurality of receiving grooves 421 receive a plurality of bumps 451 formed on a lower surface of the lens 450, respectively.

Here, the bumps 451 are formed near corners of the lower surface of the lens 450 and protrude downwards from the lens 450. The bumps 451 and the receiving grooves 421 may have the same shape.

The lens 450 is aligned on the upper surface of the housing 420 when the plural bumps 451 are received in the plural receiving grooves 421 of the housing 420.

Although not shown in the drawings, the lens 450 may be coupled to the upper surface of the housing 420 via a bonding member or structure (not shown) or an adhesive material (not shown).

The plurality of indentations 422 provide spaces in which electronic devices such as Zener diodes (not shown) can be mounted in the light emitting module 400.

The indentations 422 are arranged at regular intervals along an outer lower portion of the housing 420. For example, the indentations 422 are placed at lower corers of the housing 420.

Although the indentations 422 are illustrated as being formed at the corners of the housing 420 such that the circuit board 110 is partially exposed therethrough in this exemplary embodiment, it should be understood that the disclosed technology is not limited thereto and the housing 420 may include an indentation structure formed along a lower end thereof to expose the circuit board 110.

According to this exemplary embodiment, the light emitting module 400 includes a Zener diode (not shown) disposed in one of the plurality of indentations 422.

The housing 420 of the light emitting module 400 according to the fourth exemplary embodiment of the disclosed technology may have one of the inner surface structures of the housings according to the first to third exemplary embodiments of the disclosed technology.

Figure 10:
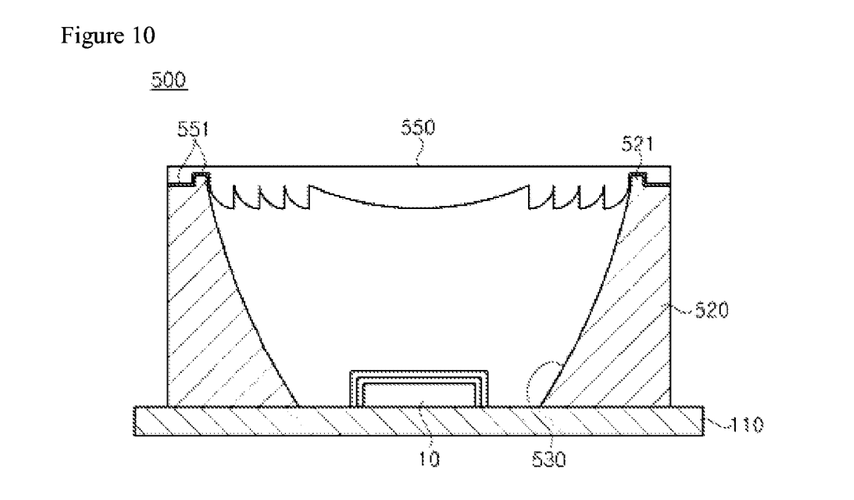
FIG. 10 is a sectional view of an exemplary light emitting module according to a fifth exemplary embodiment of the disclosed technology.

FIG. 10 is a sectional view of a light emitting module according to a fifth exemplary embodiment of the disclosed technology.

Referring to FIG. 10, a light emitting module 500 according to the fifth exemplary embodiment of the disclosed technology includes the same structure as that of the light emitting module 100 (see FIG. 3) according to the first exemplary embodiment and includes different structures for a housing 520 and a lens 550. The same components are indicated by the same reference numerals and detailed descriptions thereof are omitted.

The housing 520 resides on a circuit board 110 and surrounds a light emitting diode chip 10 mounted on the circuit board 110. The circuit board 110 may include a lead frame (not shown) or a conductive pattern (not shown), and may be a printed circuit board or a ceramic substrate. The housing 520 has a recess formed at a central region of the housing 520, and includes a bump 521 formed on an upper surface of the housing 520 and a reflective part 530 formed on an inner side surface of the recess.

The reflective part 530 has a function of reflecting light emitted from the light emitting diode chip 10 in various directions to enhance luminous efficacy of the light emitting module 500. The reflective part 530 has a curved structure extending continuously along the inner side surface of the recess. Here, although the reflective part 530 is illustrated as having one curved structure, it should be understood that the disclosed technology is not limited thereto and the reflective part may include a plurality of reflective regions divided in the vertical direction. The reflective part 530 may include a highly reflective material coating. For example, Ag may be coated onto the reflective part 530. In some implementations, Ag may be coated onto the entirety of the housing 520. In some implementations, Ag may be coated onto the circuit board 110.

The bump 521 is placed near the reflective part 530. The bump 521 protrudes in a ring shape along an edge of the recess on the upper surface of the housing. Although the bump 521 is illustrated as having a ring shape, it should be understood that the disclosed technology is not limited thereto and the bump 521 may be modified into various shapes including a polygonal shape depending upon the shape of the recess.

The upper surface and the bump 521 contact the lens 550.

The lens 550 has a flat upper surface and a lower surface having a step structure 551 at an edge thereof. The shape of the lens 550 may vary depending upon the shape of the recess. The step structure 551 faces the upper surface of the housing 520 and the bump 521. The step structure 551 can face-to-face contact the upper surface of the housing 520 and the bump 521. The lens 550 may be formed of or include silicone, epoxy, glass or PMMA, without being limited thereto. Here, a bonding layer (not shown) may be interposed between the step structure 551 and the upper surface of the housing 520 and the bump 521. The bonding layer (not shown) may be formed of or include an epoxy resin. The shape of the lower surface of the lens 550 may vary depending upon the shape of the recess. For example, the lens 550 may be or include a Fresnel. The Fresnel lens may have a plurality of patterns corresponding to the shape of the recess. For example, the plurality of patterns may have a circular structure corresponding to a circular structure of the recess. In some implementations, the plurality of patterns may have a different shape from the shape of the recess. For example, the plurality of patterns may have a quadrangular structure that is different from the circular structure of the recess.

According to this exemplary embodiment, the housing 520 includes the reflective part 530 having the curved structure formed along the inner side surface of the recess to reflect light emitted from the light emitting diode chip 10 in various directions. Accordingly, the light emitting module 500 according to this exemplary embodiment can minimize internal light loss, thereby maximizing luminous efficacy.

In addition, according to this exemplary embodiment, a contact area between the lens 550 and the housing 520 is increased by the lens 550 having the step structure 551, thereby enhancing adhesion therebetween. Further, according to this exemplary embodiment, the lens 550 is aligned on the housing 520 by the step structure 551, thereby minimizing an alignment error.

Figure 11:
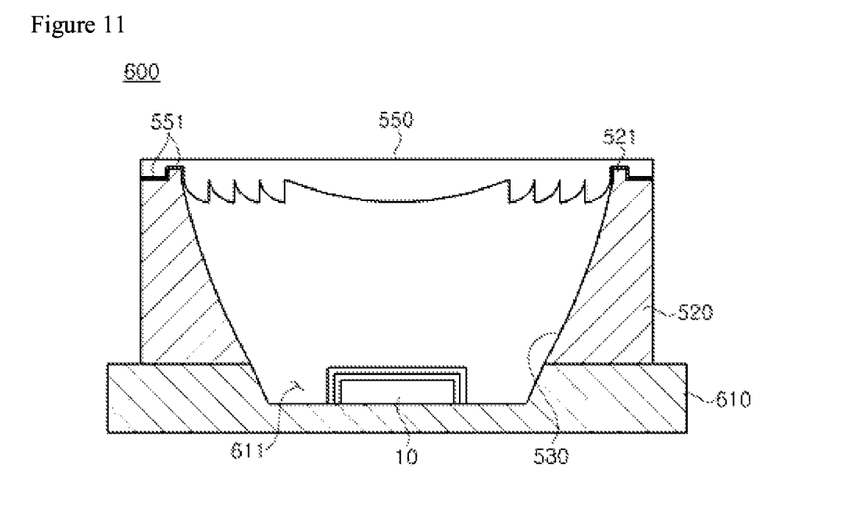
FIG. 11 is a sectional view of an exemplary light emitting module according to a sixth exemplary embodiment of the disclosed technology.

FIG. 11 is a sectional view of a light emitting module according to a sixth exemplary embodiment of the disclosed technology.

Referring to FIG. 11, a light emitting module 600 according to the sixth exemplary embodiment of the disclosed technology includes the same structure as that of the light emitting module 500 (see FIG. 10) according to the fifth exemplary embodiment and includes different structure of a circuit board 610 from that of the light emitting module 500 for. The same components are indicated by the same reference numerals and detailed descriptions thereof are omitted.

The circuit board 610 has a recess 611 formed on an upper surface thereof to receive light emitting diode chip 10. The recess 611 includes an inclined inner side surface, which reflects light emitted from the light emitting diode chip 10. The inner side surface of the recess 611 may extend from a reflective part 530 having a curved structure. The circuit board 610 may include a lead frame (not shown) or a conductive pattern (not shown), and may be a printed circuit board (PCB) or a ceramic substrate. Although the recess 611 is illustrated as extending from the reflective part 530 in this exemplary embodiment, the recess 611 may be separated a certain distance from the reflective part 530 in an inward direction.

According to this exemplary embodiment, the light emitting module includes the housing 520, which includes the reflective part 530 of the curved structure formed along the inner side surface of the recess, and the circuit board 610, which has the recess 611 receiving the light emitting diode chip 100, whereby light emitted from the light emitting diode chip 10 can be reflected along various paths. Accordingly, the light emitting module 600 according to this exemplary embodiment of the disclosed technology can minimize internal light loss, thereby maximizing luminous efficacy.

In addition, according to this exemplary embodiment, a contact area between the lens 550 and the housing 520 is increased by the lens 550 having the step structure 551, thereby enhancing adhesion therebetween. Further, according to this exemplary embodiment, the lens 550 is aligned on the housing 520 by the step structure 551, thereby minimizing an alignment error.

Figure 12:
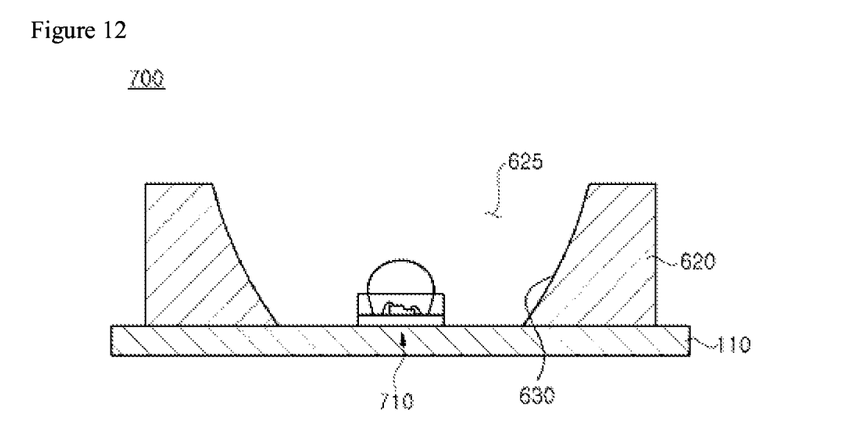
FIG. 12 is a sectional view of an exemplary light emitting module according to a seventh exemplary embodiment of the disclosed technology.

FIG. 12 is a sectional view of a light emitting module according to a seventh exemplary embodiment of the disclosed technology.

Referring to FIG. 12, a light emitting module 700 according to the seventh exemplary embodiment includes a circuit board 110, a light emitting diode package 710, and a housing 620.

The light emitting diode package 710 includes a light emitting diode chip and a lens mounted on a substrate. The light emitting diode package 710 may have an upper luminous type. The light emitting diode chip may have a vertical type or a lateral type, without being limited thereto. The light emitting diode package 710 is mounted on the circuit board 110.

The housing 620 resides on the circuit board 110 and has a recess 625 formed at a central region thereof to receive the light emitting diode package 710. Here, the circuit board 110 may include a lead frame (not shown) or a conductive pattern (not shown), and may be or include a printed circuit board or a ceramic substrate. The housing 620 includes a reflective part 630 formed on an inner side surface of the housing 620. The reflective part 630 has a function of reflecting light emitted from the light emitting diode package 710 in various directions to enhance luminous efficacy of the light emitting module 700. The reflective part 630 has a curved structure extending continuously along the inner side surface of the recess 625. Here, although the reflective part 530 is illustrated as having one curved structure, it should be understood that the disclosed technology is not limited thereto and the reflective part may include a plurality of reflective regions divided along the vertical direction. The reflective part 630 may include a highly reflective material coating. For example, Ag may be coated onto the reflective part 630. Ag may be coated onto the entirety of the housing 620 and may be coated onto the circuit board 110.

In the light emitting module according to this exemplary embodiment, the housing 620 includes the reflective part 630 having the curved structure formed along the inner side surface of the recess to reflect light emitted from the light emitting diode package 710 along various paths. Accordingly, the light emitting module 700 according to this exemplary embodiment can minimize internal light directions, thereby maximizing luminous efficacy. Although some exemplary embodiments have been described herein, it should be understood by those skilled in the art that these embodiments are given by way of illustration only and do not limit the scope of the disclosed technology. In addition, it should be understood that some features of a certain embodiment may also be applied to other embodiments without departing from the spirit and scope of the disclosed technology.

What is claimed is:
1. A light emitting module comprising:
   a circuit board;
   a light emitting diode chip flip-bonded to the circuit board; and
   a housing residing on the circuit board and surrounding the light emitting diode chip, wherein the housing has a recess and a reflective part having a curved structure formed on an inner wall of the recess,
   wherein the reflective part comprises two reflective regions including a first reflective portion and a second reflective portion, the first reflective portion being placed above the second reflective portion, and
   wherein the second reflective portion comprises protrusions protruding in a lateral direction of the light emitting diode chip, the protrusions being arranged at regular intervals along a side surface of the light emitting diode chip.

2. The light emitting module according to claim 1,
   wherein each of the first reflective portion and second reflective portion comprises at least two reflective regions each having a curved structure and placed on different locations along a height of the housing.

3. The light emitting module according to claim 2, wherein the reflective regions of the first reflective portion continuously extend parallel to each other along an inner wall of the housing.

4. The light emitting module according to claim 1, wherein the protrusions face the side surface of the light emitting diode chip.

5. The light emitting module according to claim 1, wherein the second reflective portion comprises a step portion at an interface between the first reflective portion and the protrusions.

6. The light emitting module according to claim 1, wherein the light emitting diode chip comprises a wavelength conversion layer covering upper and lower surfaces of a substrate having a semiconductor layer and an electrode pad, and a TiO2 diffusion layer covering the wavelength conversion layer.

7. The light emitting module according to claim 1, wherein the circuit board comprises a recess receiving the light emitting diode chip, an inner side surface of the recess extending from the reflective part.

8. The light emitting module according to claim 1, further comprising: a silver (Ag) coating formed on the reflective part.

9. The light emitting module according to claim 1, further comprising:
a lens disposed on the housing,
a bonding structure attaching the lens to the housing,
wherein the lens comprises at least one of silicone, epoxy, glass, or PMMA, and the bonding structure comprises an epoxy resin.

10. The light emitting module according to claim 1, wherein the circuit board comprises a lead frame or a conductive pattern, and includes a printed circuit board (PCB) or a ceramic substrate.

11. A light emitting module comprising:
a circuit board;
a light emitting diode chip flip-bonded to the circuit board; and
a housing residing on the circuit board and surrounding the light emitting diode chip, wherein the housing has a recess and a reflective part having a curved structure formed on an inner wall of the recess, wherein the housing comprises a plurality of indentations formed at outer lower ends of the housing.

12. The light emitting module according to claim 11, wherein at least one of the indentations is configured to receive an electronic device.

13. The light emitting module according to claim 11, wherein the housing further comprises a plurality of bumps protruding upwards from an upper surface of the housing, and a lens is disposed inside the bumps on the upper surface of the housing.

14. A light emitting module comprising:
a circuit board;
a light emitting diode chip flip-bonded to the circuit board; and
a housing residing on the circuit board and surrounding the light emitting diode chip, wherein the housing has a recess and a reflective part having a curved structure formed on an inner wall of the recess, wherein the housing comprises a plurality of receiving grooves formed on an upper surface of the housing.

15. The light emitting module according to claim 13, wherein the lens is disposed on the upper surface of the housing, and comprises a plurality of bumps formed on a lower surface of the housing and arranged in the receiving grooves.

16. A light emitting module comprising:
a circuit board;
a light emitting diode chip flip-bonded to the circuit board; and
a housing residing on the circuit board and surrounding the light emitting diode chip, wherein the housing has a recess and a reflective part having a curved structure formed on an inner wall of the recess, wherein the housing comprises an upper surface and a bump formed on the upper surface, the bump being placed near the reflective part.

17. The light emitting module according to claim 16, further comprising a lens disposed on the housing, wherein the lens has a step structure at an edge of a lower surface of the lens and a Fresnel lens structure inside the step structure.

18. The light emitting module according to claim 17, wherein the step structure faces the upper surface and the bump of the housing.

* * * * *